United States Patent [19]

Gershon

[11] Patent Number: 4,879,478

[45] Date of Patent: Nov. 7, 1989

[54] FAST SAMPLE AND HOLD CIRCUIT

[75] Inventor: Eugen Gershon, Los Gatos, Calif.

[73] Assignee: Advanced Micro Devices, Inc., Sunnyvale, Calif.

[21] Appl. No.: 88,989

[22] Filed: Aug. 21, 1987

Related U.S. Application Data

[63] Continuation of Ser. No. 771,434, Aug. 30, 1985, abandoned.

[51] Int. Cl.[4] .............................................. G11C 27/02
[52] U.S. Cl. ................................... 307/353; 307/257; 307/321
[58] Field of Search ............... 307/352, 353, 257, 321, 307/246, 317 A

[56] References Cited

U.S. PATENT DOCUMENTS

| | | | |
|---|---|---|---|
| 3,284,641 | 11/1966 | St. John | 307/257 |
| 3,480,795 | 11/1969 | Benson et al. | 307/353 |
| 3,702,942 | 11/1972 | Aguirre | 307/352 |
| 3,840,754 | 10/1974 | Okada et al. | 307/257 |
| 4,540,902 | 9/1985 | Ishikawa | 307/257 |

Primary Examiner—John Zazworsky
Attorney, Agent, or Firm—Mark Levy; Ronald C. Fish

[57] ABSTRACT

There is disclosed a sample and hold circuit using a four diode bridge using a voltage source and a bridge and a storage capacitor and the voltage source to be sampled coupled to the other two opposite nodes of the bridge. Switches in the lines coupling the voltage and current sources to the bridge control whether the sample and hold circuit is sampling data or holding the sampled voltage. This arrangement is characterized by extremely low sample voltage acquisition time.

30 Claims, 3 Drawing Sheets

FAST SAMPLE AND HOLD CIRCUIT

This application is a continuation division, of application Ser. No. 771,434, filed 8/30/85 now abandoned.

BACKGOUND OF THE INVENTION

The invention pertains to the field of sample and hold circuits, and, more particularly, to the field of very fast sample and hold circuits for use in disk drive servo controllers for drives having servo information written on the disk.

As part of many computer controlled servo circuits where a digital device must interface with analog signals generated by mechanical apparatus and sensors, it is necessary to convert the analog signals to digital signals that the computer can use. To do this, the analog signal, which is usually changing in magnitude over time, must be sampled at a particular time to determine its magnitude at that time such that a conversion to a digital value can be performed. It is the function of a sample and hold circuit to take this "snapshot" of the signal at the time desired.

In hard disk systems there are often surfaces which have special tracks of servo information recorded on them for reading by a servo head to control proper track position of the data heads over the desired data tracks on other surfaces. The servo tracks are predetermined flux transitions, recorded on the surface such that when the servo head is flying over them, the servo tracks generate predetermined signal patterns at the output of the servo head. Usually adjacent servo tracks have different patterns of flux transitions on them which create so called "odd" servo signals when the servo head flys over odd tracks and "even" servo signals when the servo head flys over even tracks. These signals can be distinguished because their values occur at different times.

The servo head is mechanically coupled to the data heads such when the actuator moves the servo head, the data heads move in unison. The servo tracks are recorded such that when the data heads are exactly centered over a data track, the servo head is exactly centered between the centers of adjacent odd and even servo tracks. By suitably processing the signal from the servo head in a track following mode and driving the head position actuator appropriately, the servo head can be maintained in the proper position between the two servo tracks which in turn maintains the data heads exactly centered over their data tracks.

Since the disks of hard disk storage systems spin very rapidly to provide the proper aerodynamic conditions to cause the heads to fly over the surfaces, the data from the servo tracks is changing at a very rapid rate. It is important to have a sample and hold circuit with a small "acquisition" time to be able to frequently sample the servo data and rapidly determine its analog value at every sample time. There are many other applications outside of the disk drive controller field which have a use for rapid sample and hold circuits also.

Diode bridges have traditionally been used for fast sample and hold circuits. In the past these diode bridges have coupled two current sources to a storage capacitor. FIG. 1 shows such an arrangement. The two current sources 10 and 12 were coupled to the diode bridge 14 through switches 16 and 18 which serve to signal by their closure that a sample of the input signal at the input terminal $V_3$ of the diode bridge is desired source impedance 22 were any analog voltage source for generating the annalog signal to be sampled. When the switches were closed, the capacitor $C_S$ would begin to either charge through diode $D_2$ or discharge through diode $D_4$ depending upon the relative magnitudes of the voltages $V_1$ and $V_3$. This charging or discharging continued until the voltages $V_1$ and $V_3$ were equal, at which time the bridge would be balanced and no further charging or discharging would occur.

A difficulty with this approach was that the currents from the current sources had to be closely matched to avoid unbalancing the bridge. That is, when the voltage $V_1$ and $V_3$ were equal, if the two currents $I_1$ and $I_2$ were not equal, then the difference current could cause the voltages on the bridge to shift sufficiently to cause an error or offset between the voltages $V_1$ and $V_3$ when they were supposed to be equal. Because the current source must be implemented with a PNP transistor for the current source 10 and an NPN transistor for the current source 12 because of the polarities of the diodes in the bridge 14 and the polarities of these two types of transistors, the matching was difficult to obtain. Making PNP and NPN transistors on the same die involves variations from the normal process used for making NPN transistors because it entails use of additional steps and additional mask. These additional items both increase the cost and decrease the yield of the process because of the increased complexity. Further, PNP and NPN devices have differenct intrinsic properties because of different hole and electron mobilities which translates into different gain properties, different responses to temperature variations and different switching speeds. These difference make it more difficult to match PNP and NPN devices connected as current sources even when fabricated on the same integrated circuit. The invention does not solve this matching problem. Rather, it avoids this problem by avoiding the use of two current sources.

Other embodiments of sample and hold circuits used in the past have included diode bridges and transformers with a secondary winding replacing the current sources. These circuits are impossible to integrate however since it is impossible to integrate transformers or other inductors. Integration is very desirable since it increases reliability and decreases cost of circuits, especially in high volume applications.

Accordingly, a need has arisen for an integrated sample and hold circuit using all NPN transistors or other transistors which can be easily matched and fabricated on the same die with a diode bridge. The device must be capable of rapid acquisition of the inut signal, and must be capable of allowing the voltages on the bridges to float to their natural levels. The latter requirement is necessary so that the bridge can balance itself upon matching of the output voltage from the storage capacitor to the input voltage to be sampled.

SUMMARY OF THE INVENTION

The invention, in its most general sense, is a fast sample and hold circuit utilizing a current source and a voltage source which are selectively coupled to a charge storage means depending upon the relative magnitudes of an output voltage from the charge storage device and an input voltage to be sampled. The charge storage device stores a charge and generates an output voltage which is proportional to the amount of charge stored. The selective coupling causes the amount of stored charge to be increased or decreased depending upon whether the output voltage is less than or more than the input voltage to be sampled. The purpose of the selective coupling is to change the amount of stored charge to causes the output voltage to be increased or decreased so as to match the input voltage.

In the preferred embodiment, the selective coupling is done by a diode bridge, preferably Schottky diodes or other diodes with low minority carrier charge storage. The voltage and current sources are both NPN bipolar transistors, one having the proper biasing and external devices connected to be a voltage source and the other biased and having external devices connected so as to be a current source. The two transistors also act as switches with their bases receiving a sample signal which turns the transistors on when a sample of the input signal is desired. The voltage source is coupled to the diode bridge by a resistor, and the charge storage means is a capacitor in the preferred embodiment. All devices are integrated on the same die in the preferred embodiment, but may be discrete devices in other embodiments. Other embodiments may use field effect transistors for the switchng, voltage source and current source functions.

In operation, the diode bridge disconnects the current source from the capacitor when the output voltage across the capacitor is lower than the input voltage so that the capacitor is charged by the voltage source through one diode of the bridge until the output voltage equals the voltage to be sampled. If the output voltage is larger than the voltage to be sampled when the sample signal occurs, the current source is connected to the capacitor and the voltage source is disconnected such that the capacitor is discharged until the voltage on the capacitor equals the voltage to be sampled. When the output voltage equals the voltage to be sampled, the bridge is balanced, and no current flows into or out of the capacitor. All diodes are forward biased in the balanced state, and the current source draws its fixed current out of the bridge. The voltage source and resistor coupling it to the bridge are chosen such that the current supplied to the bridge from the voltage source is approximately equal to the current drawn by the current source. Any difference flows into or out of the voltage source of the voltage to be sampled.

BRIEF DESCRIPTION OF THE DRAWINGS

FIG. 7 is a block diagram of an integrated embodiment of the apparatus of the invention.

DETAILED DESCRIPTION OF THE PREFERRED EMBODIMENT

Figure 2:
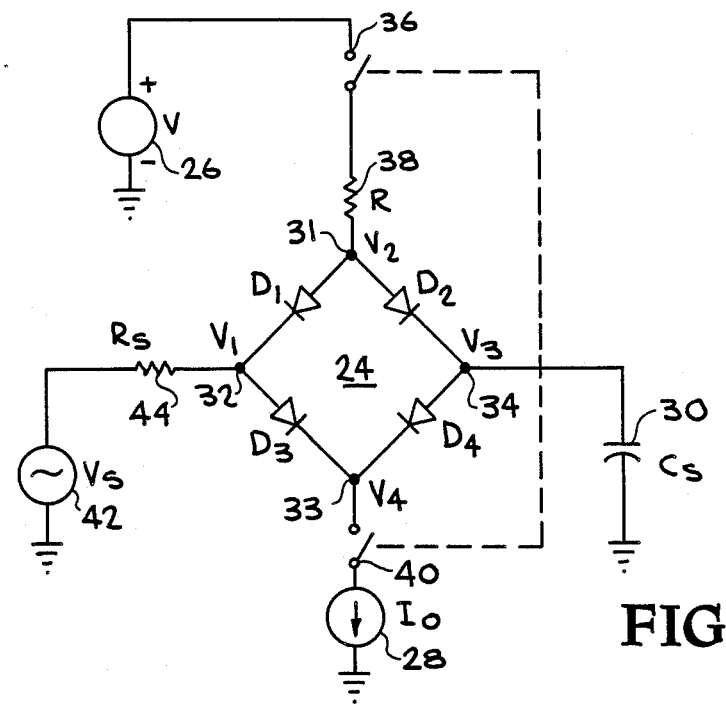
FIG. 2 is a schematic drawing of the sample and hold circuit of the invention.

Referring to FIG. 2, there is shown a schematic diagram of the sample and hold circuit of the invention. A diode bridge 24 serves to selectively couple a voltage source 26 and a current source 28 to a storage capacitor 30. The diode bridge has four nodes 31–34, with diodes $D_1$ and $D_2$ having their anodes coupled to the node 31 and their cathodes coupled to the nodes 32 and 34 respectively. Diodes $D_3$ and $D_4$ have their cathodes coupled to the node 33 and their anodes coupled to the nodes 32 and 34 respectively. The voltage source is coupled to the node 31 through a switch 36 and a resistor 38. The current source 28 is coupled to the node 33 through a switch 40. The storage capacitor is coupled between the node 34 and ground, and the voltage to be sampled is input to the node 32. A voltage source 42 supplying a voltage $V_s$ and having a source resistance 44 is shown as supplying the voltage to be sampled.

The sample and hold circuit of FIG. 2 is designed to charge the capacitor 30 until the voltage at the node 34 equals the voltage existing at the node 32. This process begins at the time the switches 36 and 40 close. When the switches close, a selective coupling of the voltage source 26 and current source 28 occurs to the nodes 32 and 34 respectively depending upon the relative magnitude of the voltage $V_3$ at the node 34 and the voltage $V_1$ at the node 32. If $V_3$ is greater than $V_1$, the diodes $D_4$ and $D_1$ will be forward biased so as to be essentially shorts and the diodes $D_3$ and $D_2$ will be reversed biased so as to be essentially open circuits. The reason for this is that $V_4$ can be no greater voltage than one forward biased diode drop below $V_3$ and $V_3$ is greater than $V_1$. Thus $V_4$ will be greater than $V_1$ unless $V_1$ is within one forward biased diode drop of $V_3$, a special cause which will be considered later. The diode $D_3$ is therefore reverse biased, while $D_4$ is forward biased. Likewise, the voltage $V_2$ is no greater than one forward biased diode drop above $V_1$, and $V_1$ is less than $V_3$ so the diode $D_2$ is reversed biased, while the diode $D_1$ is forward biased.

Figure 3:
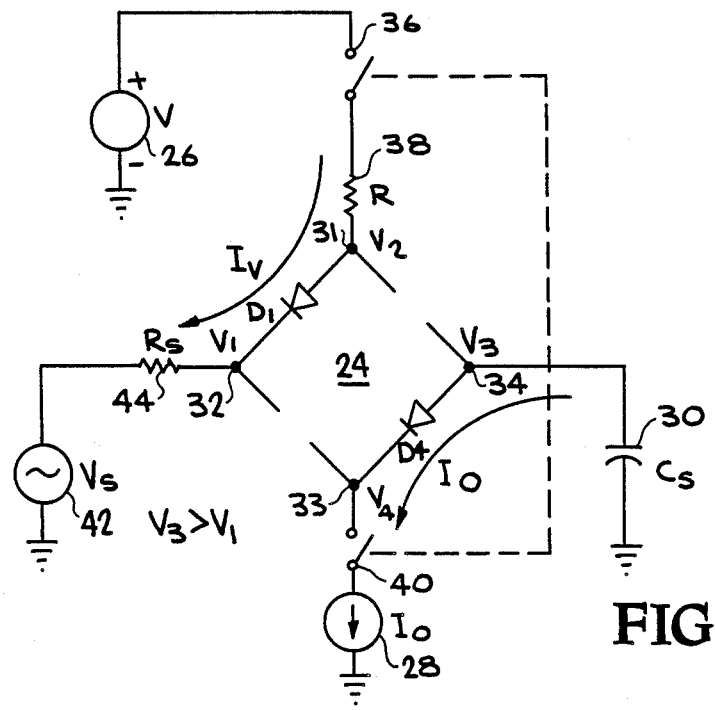
FIG. 3 is a diagram of current flow in the case where $V_3$ is greater than $V_1$.

The resultant current flow in the situation where $V_3$ is greater than $V_1$ is illustrated at FIG. 3 which shows the diodes $D_2$ and $D_3$ removed from the circuit. In this situation the capacitor 30 is selectively coupled to the current source 28 which draws a fixed current $I_o$ out of the capacitor 30 through the diode $D_4$ to reduce the voltage across the capacitor consequently reducing the voltage $V_3$ toward the level of the voltage $V_1$. The value of the current $I_o$ is established by the biasing and circuit elements used to implement the current source 28. Likewise, the voltage source 26 is selectively coupled to the input terminal 32 and supplies a current $I_v$ through the diode $D_1$ to the voltage source 42 of the voltage to be sampled. The current $I_v$ equal to $(V - V_s)/(R + R_s)$. Since an ideal voltage source has a zero source resistance 44, the current $I_v$ flowing through the source resistance 44 will not alter the voltage $V_1$. Higher source resistances 44 will change the voltage $V_1$ slightly, so it is best to minimize the source resistance 44 to minimize the voltage difference between $V_s$ and $V_1$.

Acquisition time is the time that it takes for a sample and hold circuit to charge or discharge its capacitor such that the output voltage equals the voltage to be sampled. In the case of FIG. 3, the acquisition time can be tailored by establishing the value of $I_o$ relative to the capacitance $C_s$ of the capacitor 30 such that the capacitor can be charged or discharged to the maximum or minimum expected values for the voltage on the node 32 within the desired acquisition time. Note that the switches 36 and 40 preferably close together and must be closed for at least the acquisition time.

Figure 4:
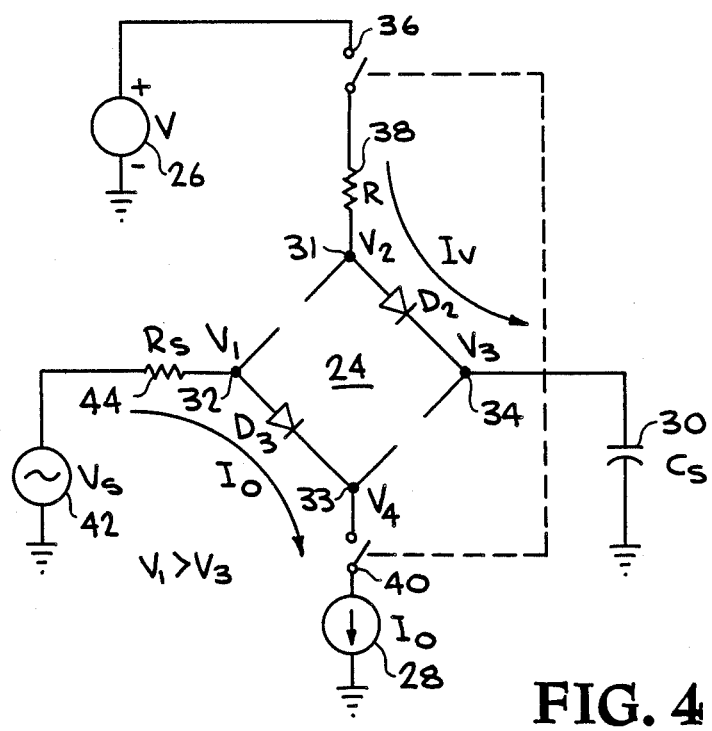
FIG. 4 is a diagram of current flow in the case where $V_1$ is greater than $V_3$.

If the voltage $V_3$ was less than the voltage $V_1$ when the switches closed, or if the capacitor 30 is discharged to the point that $V_3$ is less than $V_1$, then the situation depicted in FIG. 4 arises. In this situation the diodes $D_1$ and $D_4$ become reverse biased and disappear from the circuit, i.e., they act as open circuits. Conversely, the diodes $D_3$ and $D_2$ are forward biased, and act to selectively coupled the current source 28 to the input terminal 32 and the voltage source 42 of the voltage to be sampled, and to couple the voltage source 26 through the resistor 38 and the diode $D_2$ to the capacitor 30. The capacitor 30 begins to charge as the current $I_y$ flows into it to cause the voltage $V_3$ to approach the voltage $V_1$. The voltage V from the voltage source 26, and the value R of the resistor 38 are selected such that the current $I_y$ is approximately matched to the value of the current $I_0$. The actual value of the current $I_y$ at any particular time equals $(V-V_2)/R$. Since $V_2$ swings over a voltage range related to the voltage swings of $V_1$ and $V_3$, the current $I_y$ also swings over a range. However, the values of R and V are picked such that V is greater than any expected $V_1$ and such that the current $I_y$ is equal to $I_o$ in the middle of its range.

FIG. 4, the diode $D_3$ conducts a current $I_o$ drawn by the current source 28 out of the voltage source 42. If the source resistance 44 is sufficiently small, the voltage $V_1$ does not change appreciably as a result of this current flow $I_o$ through the source resistance 44.

as $V_3$ approaches $V_1$, the amount of current flow $I_y$ is defined by $(V-V_2)/R$. The current $I_y$ decreased as the voltage $V_2$ increases since $V_2$ follows $V_3$. With V much, much greater than $V_2$, the charging of capacitor 30, and the rise of $V_3$ are almost linear with time. The rise of voltage on a capacitor is 1/C times the integral of the current over the time of charging.

When $V_1 = V_3$, $V_2$ is one diode drop above the voltages $V_1$ and $V_3$, while $V_4$ is one diode drop below $V_1$ and $V_3$. In this situation all diodes are forward biased, and the situation of FIG. 2 exists. Assuming ideal diodes, the diode bridge acts as a node in this case, and the current $(V-V_2)/R$ flows through the resistor into the bridge 24 and is divided between the two halves of the bridge, while the current $I_o$ flows out of the bridge 24 drawn by the current source 28. Any mismatch between $I_o$ and the current flowing through the resistor 38 flows into or out of the voltage source 42. No current flows into or out of the capacitor except for the current needed to replace lost charge due to leakages through the capacitor 30 and from the node 34 to the outside world. That this is true is self evident since if there were current of any appreciable magnitude flowing into or out of capacitor 30, then the voltage $V_3$ would be rising or falling away from the voltage $V_1$, and the situation would revert to the unbalanced bridge situation depicted in FIGS. 3 or 4. The capacitor would then become charged or discharged until the voltage at $V_3$ once again became equal to the voltage at $V_1$.

The leakage currents from the node 34 to the outside world and across the capacitor 30 represent a source of hold time drift after the switches 36 and 40 open since after these switches open, no further replacement of lost charge can occur from the voltage source 26. The leakages from the node 34 consist of any reverse bias junction leakage through the diodes, leakages through parasitic capacitances associated with the switches 36 and 40 and any leakage through the input impedance of the following stage coupled to the node 34 to read the voltage $V_3$ and do with it whatever is to be done. Selection of the value for the capacitor 30 can be made such that its value is sufficiently large that these leakages during the hold time do not represent an intolerable error. Excessively large values for the capacitor 30 however, will increase the acquisition time unless a large current can be supplied from the current source 28 and the voltage source 26. It will be understood by those skiled in the art that the value of the resistor 38 should be kept as low as possible to minimize the acquisition time. The resistor 38 must be present however to allow the voltage $V_2$ float in the range related to the range of $V_1$ and $V_3$. If the resistor 38 is not present, and the source resistance of the voltage source 26 (not shown) is not sufficiently high (ideally it is zero), then the voltage on the node 31 will be forced to be the voltage V which will prevent the diode bridge from working properly since diodes $D_1$ and $D_2$ will always be on thereby preventing the selective coupling action from occurring.

Figure 1:
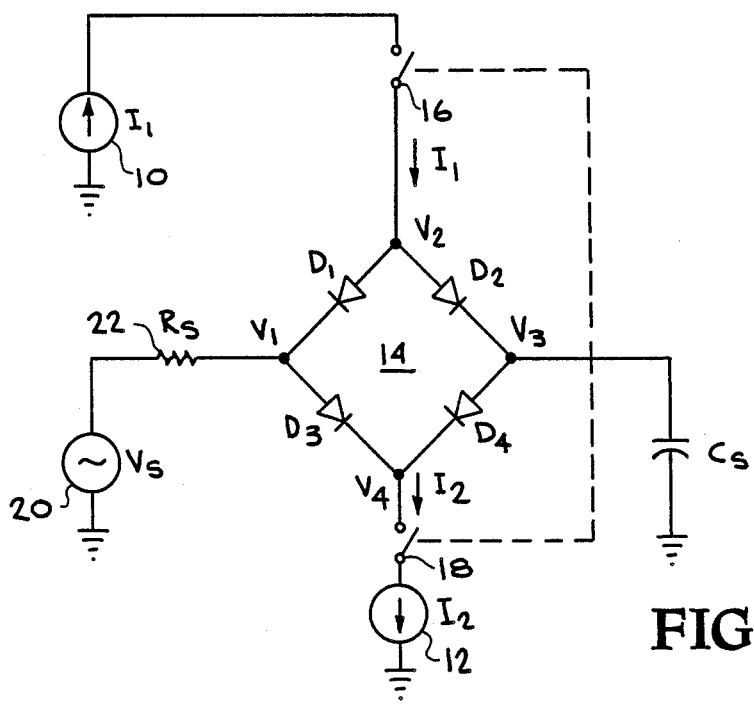
FIG. 1 is a schematic drawing of a sample and hold circuit which has been used in the past.

Note that in either of the cases presented in FIGS. 3 or 4, the current source 28 draws a current sourced from a voltage source and not another current source. Since voltage sources can supply substantially any current at a fixed voltage, there is no need for matching the currents of two current sources as in the case of FIG. 1. Thus there is no difficulty with artificial voltages being forced on the bridge, or unbalancing of the bridge caused by mismatched current sources causing errors in the sampling process.

Figure 5:
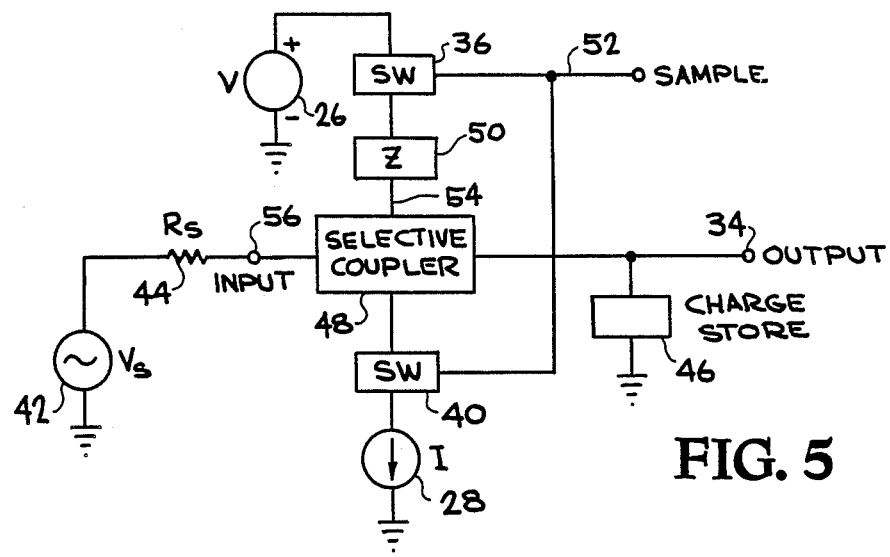
FIG. 5 is a schematic drawing of the most general sense of the invention to illustrate the funtional relationships of each element and the relationships between the elements.

Referring to FIG. 5 there is shown the most general form of the invention. The embodiment shown in FIG. 5 functions to create an output voltage on the node 34 which is related to the charge stored in a charge storage device 46 such that greater charge stored translates into a higher output voltage. The charge storage means 46 can be any circuit which generates an output voltage which is related to the amount of current which has flowed into or out of the charge storage device 46 over the sample period while the switches 36 and 40 are closed. The switches 36 and 40 can be any devices which can switch the voltage source 26 and current source 28 into current communication with the selective coupler 48 upon receipt of a sample signal on the line 52. The switching speed of the switches should be significantly faster than the acquisition time.

The impedance 50 serves to control the amount of current flowing into the selective coupler 48 on the line 54 and to allow the voltage on the selective coupler node coupled to the line 54 to not be forced to the voltage V. The impedance should be a resistance as any inductive or capacitive portion of the impedance would lead to undesirable switching transients.

The selective coupler 48 functions to couple either the voltage source 26 or the current source 28 to the charge store 46 to increase or decrease the stored charge to cause the output voltage to match the voltage on the input terminal 56. The selective coupler can be any circuit that couples the voltage source 26 to the charge storage device 46 when the output voltage on the node 34 is less than the voltage on the input node 56 and which couples the current source 28 to the charge storage device 46 when the output voltage is greater than the input voltage at the start of the sample period. In some embodiments of the selective coupler where the voltage on the node connected to the branch 54 does not matter to carry out the above function, the imopedance 50 may be eliminated.

Figure 6:
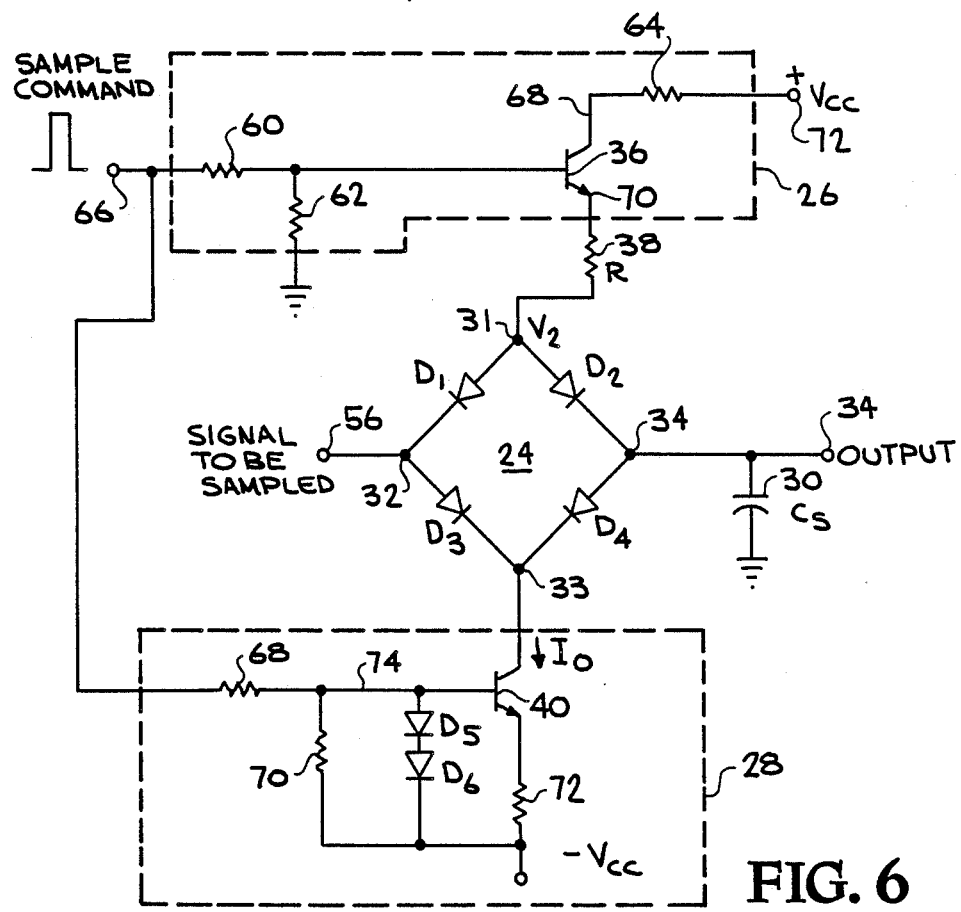
FIG. 6 is a schematic drawing of the preferred embodiment of the invention.

Referring to FIG. 6 there is shown the preferred embodiment of the invention. The diode bridge 24 is the same structure as in the other embodiments and functions in the same way. The resistor 38 is the same and serves the same function. The voltage source 26 and the switch 36 are combined into a single NPN transistor 36. The bias level for the base drive of the transistor 36 is established by the resistors 60 and 62, and the collector load is established by the resistor 64. A sample pulse input 66 receives a sample pulse which is a positive going pulse of sufficient magnitude to drive the transistor 36 such that the emitter 70 is at a voltage which is much higher than the voltage $V_2$ at the node 31.

The switch 40 and current source 28 are replaced in FIG. 6 by the NPN transistor 40 and its associated circuitry. The transistor 40 is biased as a current source by the presence of the resistors 68 and 70, the diodes $D_5$ and $D_6$ and the emitter feedback resistor 72. The resistors 68 and 70 divide the sample pulse voltage to establish a base drive voltage on the base 74 of the transistor 40, and this base drive voltage is regulated to a temperature compensated base drive reference voltage equal to two forward biased diode drops by the diodes $D_5$ and $D_6$. This base drive establishes a fixed collector current which is drawn out of the node 33, which constant current is maintained constant by the negative feedback to the base emitter voltage of the transistor 40 caused by the presence of the resistor 72.

In the preferred embodiment, the transistors 40 and 36 are Schottky clamped bipolar transistors, but in other embodiments they could be FET's, gallium arsenide devices, Josephson junctions, ballistic effect devices, or other switching devices. The diodes $D_1$-$D_6$ are Schottky diodes in the preferred embodiment or other low minority carrier storage diodes for maximum switching speeds. With a value of 10 milliamperes for $I_o$ and a value of 20 picofarads for the capacitor 30, a charge of voltage on the capacitor 30 of 0.5 volts per nanosecond is obtained which yields an acquisition time of 1 nanosecond for an input voltage excursion of plus or minus 1 volts.

FIG. 7 is a block diagram of an integrated embodiment of the apparatus of the invention. Those skilled in the art will appreciate that the exact detail of the structure of the integrated version of the invention is not critical to the invention and that many different versions of such an integrated structure may be made using the many different bipolar integration processes that are known today. Those skilled in the art will understand how to integrate the structure symbolically shown in FIG. 7 using any of the known bipolar processes.

Although the invention has been described in terms of the embodiments shown above, it will be understood by those skilled in the art that many modifications can be made without departing from the spirit and scope of the invention. All such modifications are intended to be included within the claims appended hereto.

What is claimed is:

1. A sample and hold circuit comprising:
an input terminal for receiving an input signal to be sampled;
a charge storage means to create an output signal at an output terminal in proportion to the amount of charge stored therein;
current source means for supplying a constant current;
voltage source means for supplying a constant voltage at an output terminal;
a bridge means coupled between said input terminal and said charge storage means and coupled to said current source means and to said voltage source means for selectively charging said charge storage means either with a variable current from said voltage source means or discharging said charge storage means with a fixed current drawn by said current source means depending upon the relative magnitudes of said input signal and said output signal to thereby change said output signal until it substantially matches said input signal;
a resistor coupled between said output terminal of said voltage source means and said bridge means for limiting the maximum current which can be drawn from said voltage source means.

2. The circuit of claim 1 further comprising switch means for simultaneously coupling said voltage source means and said current source means to said bridge means when sampling is desired.

3. The circuit of claim 2 wherein said switch means is two bipolar transistors.

4. The circuit of claim 2 wherein said switch means includes a bipolar transistor and said charge storage means is a capacitor.

5. The circuit of claim 2 further comprising a sample input for receiving a sample signal indicating when sampling is desired, said sample input coupled to a terminal of said switching means so as to cause said switching means to couple said voltage source means and said current source means to said bridge means when said sample signal is received.

6. The apparatus of claim 2 wherein said charge storage means is a capacitor.

7. The appartus of claim 6 wherein said capacitor has a value which is large compared to parasitic capacitances in said bridge means, said switch means and any capacitance that might be coupled to said output terminal when said sample and hold circuit is in operation.

8. The apparatus of claim 2 wherein said voltage source means is further for providing a constant voltage which is larger than any expected signal voltage to be sampled.

9. The apparatus of claim 1 wherein said bridge means comprises a pluarality of diodes at least two of which have their anodes coupled to said voltage source means and their cathodes coupled to said input terminal and said charge storage means respectively, and at least two diodes having their cathodes coupled to said current source means and having their anodes coupled respectively to said input terminal and said charge storage means.

10. The apparatus of claim 9 wherein said diodes are low minority carrier charge storage diodes.

11. The apparatus of claim 9 wherein said diodes are Schottky diodes.

12. The apparatus of claim 7 wherein said capacitor has a leakage factor which is small enough to meet user defined hold time decay specifications when considered in light of the other leakage factors in the circuit and the value of the capacitor.

13. The apparatus of claim 1 wherein said current source means is a bipolar transistor having a base, emitter and collector, said bipolar transistor having its collector coupled to said bridge means and having its emitter coupled to a second bias voltage source through a resistor, and having its base coupled to a sample signal input.

14. The apparatus of claim 13 wherein said transistor is NPN.

15. The apparatus of claim 1 wherein said charge storage means is a capacitor and the capacitor value and the current supplied by said current source are such that, considering the size of the capacitor, the acquisition time of said sample and hold circuit is less than 500 nanoseconds.

16. The apparatus of claim 1 wherein said voltage source means and said current source means and transistors driven as voltage and current sources, respectively.

17. The apparatus of claim 10 wherein said diodes are fabricatd on an integrated circuit and have closely matched electrical characteristics.

18. A sample and hold circuit comprising:
an input terminal for receiving an input signal to be sampled;
a charge storage means to create an output signal at an output terminal in proportion to the amount of charge stored therein;
a current source;
a voltage source;
an impedance source having a resistance component and having a first terminal coupled to said voltage source and having a second terminal;
a bridge means coupled between said input terminal and said charge storage means for selectively coupling either said current source of said second terminal of said impedance source to said charge storage means depending upon the relative magnitudes of said input signal and said output signal to thereby change said output signal until it substantially matches said input signal;
and wherein said voltage source is a bipolar transistor having a base, emitter and collector, said bipolar transistor having its collector coupled to a first bias voltage source wherien said impedance is a resistor coupling the emitter of said bipolar transistor to said bridge means and wherein said bipolar transistor has its base coupled to a sample signal input.

19. A sample and hold circuit comprising:
an input terminal for receiving an input signal to be sampled;
a charge storage means to create an output signal at an output terminal in proportion to the amount of charge stored therein;
a current source;
a voltage source;
an impedance having a resistance component and having a first terminal coupled to said voltage source and having a second terminal;
a bridge means coupled between said input terminal and said charge storage means for selectively coupling either said current source or said voltage source through said impedance via said second terminal of said impedance to said charge storage means depending upon the relative magnitudes of said input signal and said output signal to thereby change said output signal until it substantially matches said input signal; and
wherein said voltage source is a bipolar transistor having a base, emitter and collector, said bipolar transistor having its collector coupled to a frist bias voltage source and wherein said impedance is a resistor coupling the emitter of said bipolar transistor to said bridge means and said bipolar transistor having its base coupled to said input signal; and
wherein said bipolar transistor is NPN.

20. A sample and hold circuit comprising:
a charge storage means for generating an output voltage proportional to a stored charge;
an input terminal for receiving a voltage to be sampled;
a voltage source means for supplying a first variable current to said charge storage means when said output voltage is less than said input voltage to be sampled and a second variable current to a voltage source coupled to said input terminal when said output voltage is greater than said input voltage to be sampled;
a current source means for drawing a third substantially fixed current from a voltage source coupled to said input terminal when said output voltage is less than said input voltage to be sampled and for drawing said third fixed current from said charge storage means when said output voltage is greater than said input voltage to be sampled.

21. The apparatus of claim 20 further comprising switching means to selectively, simultaneously activate said voltage source and said current source upon receipt of a sample signal.

22. The apparatus of claim 20 wherein said voltage source means and current source means includes a shared diode bridge of matched, low minority carrier charge diodes.

23. The apparatus of claim 22 wherein said voltage source means includes a D.C. voltage source having a voltage greater than any expected input voltage to be sampled and a current limiting resistor coupling said voltage source to said diode bridge, and said current source means includes a current source for drawing a current out of said diode bridge substantially equal to the voltage of said voltage source voltage divided by the value of said current limiting resistor.

24. The apparatus of claim 21 further comprising a diode bridge coupled to said input terminal and to said charge storage means, and wherein said switching means includes two NPN bipolar transistors having their bases coupled to an input terminal for receiving a sample signal and connected so as to couple said voltage source and current source means to said diode bridge upon receipt of said sample signal.

25. The apparatus of claim 22 wherein said bridge disconnects said input terminal from said charge storage means during the time sampling is not desired.

26. A sample and hold circuit comprising:
a capacitor;
a voltage source comprised of an NPN transistor having its collector for coupling through a resistor to a bias voltage source and having its emitter coupled through a resistor to a bias terminal;
a current source;
an input terminal for receiving an unknown signal;
means coupled to said input terminal, said bias terminal, said capacitor and to said current source for selectively coupling said voltage source to charge said capacitor to the voltage of said unknown signal or to couple said current source to discharge said capacitor to the voltage of said unknown signal depending upon the relative magnitudes of the voltage of said unknown signal and the voltage across said capacitor.

27. The apparatus of claim 26 wherein said bridge means, said voltage source and said current source, and said selective coupling means are fabricated on an integrated circuit die.

28. A method of sampling and holding an unknown signal and generating a signal having substantially the same magnitude comprising the steps of:

charging a capacitor using a variable current from a voltage source through a resistor coupled to a diode bridge when the voltage across the capacitor is less than the voltage to be sampled; and discharging the capacitor with a constant current from a current source through said diode bridge when the voltage across the capacitor is greater than the voltage to be sampled.

29. The method of claim 28 further comprising the step of coupling said voltage source and said current source selectively to said capacitor depending upon the relative magnitude of the voltage to be sampled and the voltage across the capacitor.

30. The method of claim 29 further comprising the step of preventing the selective coupling to said capacitor at times other than when sampling is desired.

* * * * *